United States Patent
Iwai et al.

(10) Patent No.: US 8,929,692 B2
(45) Date of Patent: Jan. 6, 2015

(54) INTEGRATED OPTICAL DEVICE AND MANUFACTURING METHOD OF THE SAME

(75) Inventors: Norihiro Iwai, Kanagawa (JP); Hirotatsu Ishii, Kanagawa (JP)

(73) Assignee: Furukawa Electric Co., Ltd., Tokyo (JP)

(*) Notice: Subject to any disclaimer, the term of this patent is extended or adjusted under 35 U.S.C. 154(b) by 65 days.

(21) Appl. No.: 13/594,978

(22) Filed: Aug. 27, 2012

(65) Prior Publication Data

US 2013/0064497 A1 Mar. 14, 2013

(30) Foreign Application Priority Data

Sep. 8, 2011 (JP) .................. 2011-196151
Jul. 3, 2012 (JP) .................. 2012-149952

(51) Int. Cl.

| | |
|---|---|
| G02B 6/43 | (2006.01) |
| G02B 6/12 | (2006.01) |
| H01S 5/024 | (2006.01) |
| H01S 5/026 | (2006.01) |
| H01S 5/06 | (2006.01) |
| H01S 5/10 | (2006.01) |
| H01S 5/227 | (2006.01) |
| H01S 5/343 | (2006.01) |
| H01S 5/20 | (2006.01) |
| G02B 6/122 | (2006.01) |

(52) U.S. Cl.
CPC ......... *G02B 6/12004* (2013.01); *H01S 5/02453* (2013.01); *H01S 5/026* (2013.01); *H01S 5/0612* (2013.01); *H01S 5/106* (2013.01); *H01S 5/227* (2013.01); *H01S 5/34306* (2013.01); *H01S 5/2063* (2013.01); *G02B 6/1228* (2013.01)
USPC ........................................... 385/14

(58) Field of Classification Search
CPC .......... G02B 6/43; G02B 6/42; H01S 5/0261; H01S 5/0262
USPC ............................................. 385/14; 398/201
See application file for complete search history.

(56) References Cited

U.S. PATENT DOCUMENTS 5,790,580 A * 8/1998 Sakata et al. .............. 372/50.121
(Continued)

FOREIGN PATENT DOCUMENTS

WO 2011013480 A1 2/2011

OTHER PUBLICATIONS

K. Shinoda, et al., "Highly reliable operation of InGaAlAs/InGaAsP integrated lasers," Indium Phosphide & Related Materials, PRM '07. IEEE 19th International Conference, IEEE, May 2007, pp. 39-42.
(Continued)

*Primary Examiner* — Charlie Peng
(74) *Attorney, Agent, or Firm* — Lowe Hauptman & Ham, LLP

(57) ABSTRACT

Provided is an optical integrated device comprising a first waveguide that is formed on a substrate and includes a first optical path; an electrode formed on the first waveguide; a second waveguide that is formed on the substrate and includes a second optical path; and a transparent waveguide that is formed on the substrate between the first waveguide and the second waveguide, and includes a transparent core that serves as an optical path and is formed of a material having higher bandgap energy than the first optical path. The electrode is formed above the first waveguide and is not formed above the transparent waveguide, and elements including the first waveguide are optically active elements that operate according to current injected thereto.

9 Claims, 14 Drawing Sheets

(56) References Cited

U.S. PATENT DOCUMENTS

| | | | |
|---|---|---|---|
| 6,018,539 A * | 1/2000 | Kimura et al. | 372/45.01 |
| 6,034,983 A * | 3/2000 | Fujii et al. | 372/43.01 |
| 2003/0095737 A1* | 5/2003 | Welch et al. | 385/14 |
| 2009/0202196 A1* | 8/2009 | Kish et al. | 385/14 |
| 2012/0128375 A1 | 5/2012 | Kimoto et al. | |

OTHER PUBLICATIONS

K. Shinoda, et al., "InGaAlAs-InGaAsP Heteromaterial Monolithic Integration for Advanced Long-Wavelength Optoelectronic Devices", IEEE Journal of Quantum Electronics, vol. 45, No. 9, Sep. 2009, pp. 1201-1209.

* cited by examiner

INTEGRATED OPTICAL DEVICE AND MANUFACTURING METHOD OF THE SAME

The contents of the following Japanese patent applications are incorporated herein by reference:
NO. 2011-196151 filed on Sep. 8, 2011, and
NO. 2012-149952 filed on Jul. 3, 2012.

BACKGROUND

1. Technical Field

The present invention relates to an optical integrated device and an optical integrated device manufacturing method.

2. Related Art

An optical integrated device is known in which a semiconductor laser, an optical waveguide, and a modulator are integrated monolithically on a single substrate, as shown in Patent Document 1, for example.

Patent Document 1: K. Shinoda, et al., "Highly reliable operation of InGaAlAs/InGaAsP integrated lasers," Indium Phosphide & Related Materials, 2007. IPRM '07. IEEE 19th International Conference, IEEE, May 2007, pp. 39-42

In a monolithic integrated optical integrated device, there is a region where an optically active element that includes an electrode, such as a semiconductor laser, is coupled to another element. In the optical integrated device, the region where the optically active element and the other element are coupled is usually formed using a regrowth technique. However, when current flows from the electrode of the optically active element to the interface between the optically active element and the other element, generation and propagation of crystal defects is promoted. These crystal defects degrade the characteristics of the elements and decrease the reliability of the optical integrated device, particularly for the optically active elements. Therefore, a decrease in the current flowing through this interface is desired.

There is a proposal for offsetting the electrode of the optically active element from the interface between the optically active element and the other element, in a direction away from the other element, in order to restrict the current flowing through the interface between the optically active element and the other element. However, when the offset amount of the electrode is too small, the current flowing through the interface between the optically active element and the other elements cannot be decreased, and therefore the degradation of the element characteristics and the loss of reliability cannot be prevented. Furthermore, if the offset amount of the electrode is too large, the current flowing through a region near the interface between the optically active element and the other element becomes small. As a result, the optical absorption increases in this region, and the optically active element is degraded. Accordingly, when offsetting the electrode of the optically active element from the interface between the optically active element and the other element, in a direction away from the other element, it is necessary to control the position of the interface and the position of the electrode with accuracy in a range of several microns. However, due to restrictions on the accuracy of lithography, the yield for the optical integrated device manufacturing process and the characteristics of the optically active element are decreased. Therefore, another method is desired to decrease the current flowing through the interface between the optically active element and the other element.

The optically active element is an element that receives power from an electrode and uses this power. The optically active element may be a semiconductor light emitting diode element, a semiconductor laser element, an optical amplifier, or an EA modulator, for example. These optically active elements realize effects such as natural emission, induced emission, and electro-optical effects.

SUMMARY

According to a first aspect of the present invention, provided is an optical integrated device comprising a first waveguide that is formed on a substrate and includes a first optical path; an electrode formed on the first waveguide; a second waveguide that is formed on the substrate and includes a second optical path; and a transparent waveguide that is formed on the substrate between the first waveguide and the second waveguide, and includes a transparent core that serves as an optical path and is formed of a material having higher bandgap energy than the first optical path. The electrode is formed above the first waveguide and is not formed above the transparent waveguide, and elements including the first waveguide are optically active elements that operate according to current injection therethrough.

According to a second aspect of the present invention, provided is a method for manufacturing an optical integrated device, comprising first waveguide formation of forming, on a substrate, a first waveguide having a first optical path and a transparent waveguide that is coupled to the first waveguide and has a transparent core serving as an optical path and formed of a material having higher bandgap energy than the first optical path; second waveguide formation of forming a second waveguide that includes a second optical path and is coupled to the transparent waveguide; and electrode formation of forming an electrode on the first waveguide, fabricating an optically active element that operates according to current injection therethrough, and not forming the electrode above the transparent waveguide.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
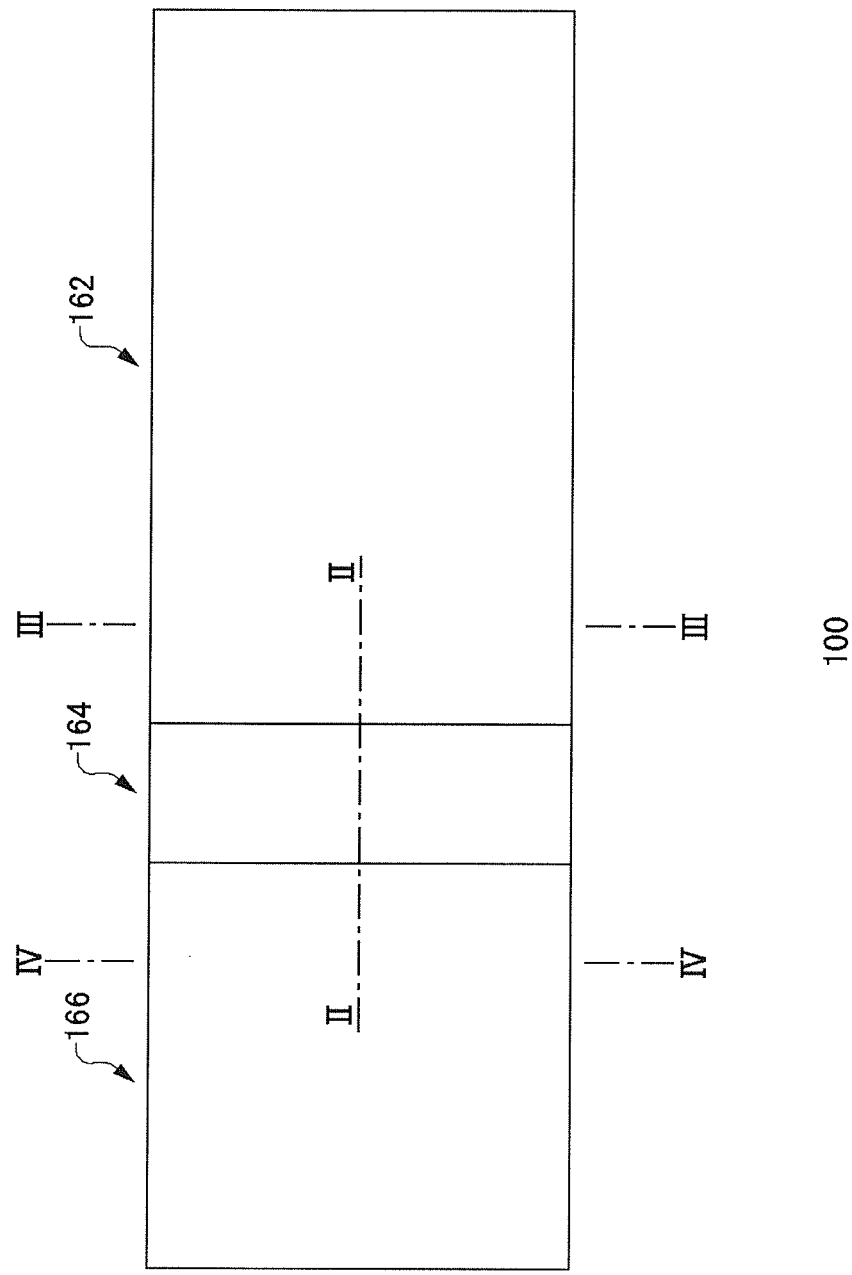
FIG. 1 is a schematic overhead view of an optical integrated device according to a first embodiment of the present invention.

FIG. 1 is a schematic overhead view of an optical integrated device 100 according to a first embodiment of the present invention. The optical integrated device 100 includes a semiconductor laser 162, a transparent waveguide 164, and an optical waveguide 166. The semiconductor laser 162 emits laser light. The oscillation wavelength of the primary-mode laser light of the semiconductor laser 162 may be 1310 nm or 1550 nm, for example. The transparent waveguide 164 is coupled to the semiconductor laser 162. The optical waveguide 166 is coupled to the transparent waveguide 164. The laser light emitted by the semiconductor laser 162 is guided to the optical waveguide 166 through the transparent waveguide 164.

Figure 2:
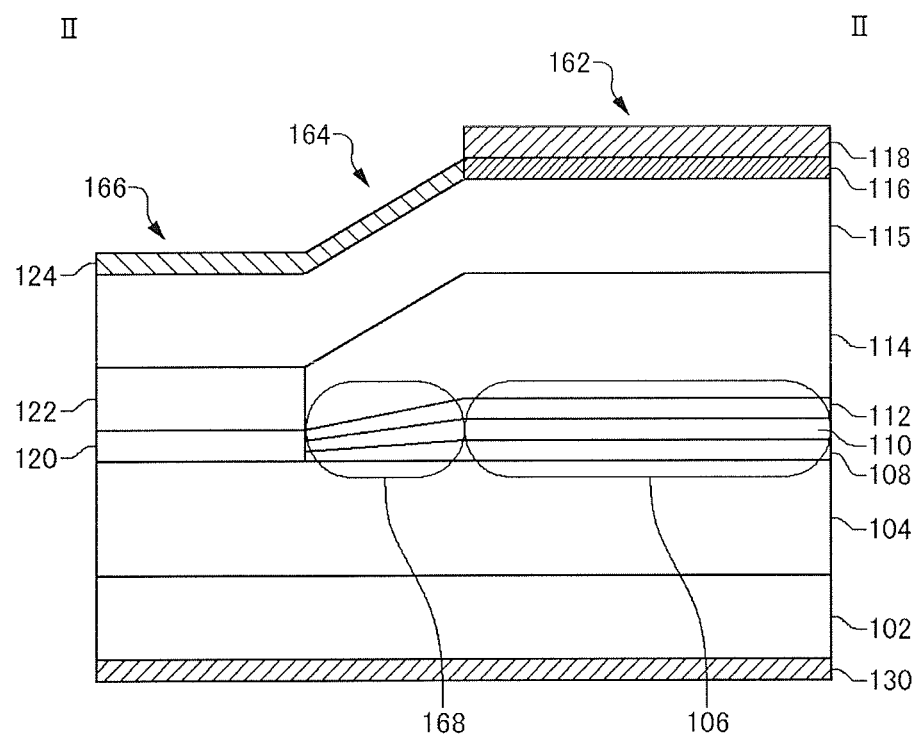
FIG. 2 is a schematic cross-sectional view of the semiconductor laser, the transparent waveguide, and the optical waveguide of the optical integrated device according to the first embodiment.

FIG. 2 is a schematic cross-sectional view of the semiconductor laser 162, the transparent waveguide 164, and the optical waveguide 166 of the optical integrated device 100 according to the first embodiment, over the line II-II of FIG. 1. The semiconductor laser 162 includes a substrate 102, a lower cladding layer 104, an active layer 106, an upper cladding layer 114, a p-InP layer 115, a contact layer 116, a p-side electrode 118, and an n-side electrode 130. The active layer 106 includes a lower light confinement layer 108, a multiquantum well layer 110, and an upper light confinement layer 112, and serves as an optical path in the semiconductor laser 162.

In the cross section over II-II, the transparent waveguide 164 includes the substrate 102, the lower cladding layer 104, the transparent core 168, the upper cladding layer 114, the p-InP layer 115, a protective film 124, and the n-side electrode 130. The transparent core 168 includes the upper light confinement layer 112, the multiquantum well layer 110, and the lower light confinement layer 108 extending from the active layer 106 of the semiconductor laser 162, and serves as an optical path in the transparent waveguide 164. In the cross section over II-II, the optical waveguide 166 includes the substrate 102, the lower cladding layer 104, the core layer 120, the upper cladding layer 122, the p-InP layer 115, the protective film 124, and the n-side electrode 130.

In the semiconductor laser 162, the transparent waveguide 164, and the optical waveguide 166, the lower cladding layer 104 is formed on the substrate 102. The lower cladding layer 104 is formed of a group III-V compound semiconductor having a refractive index lower than that of the active layer 106, the transparent core 168, and the core layer 120. For example, the lower cladding layer 104 may be formed of n-InP.

In the semiconductor laser 162 and the transparent waveguide 164, the lower light confinement layer 108 is formed on the lower cladding layer 104. The multiquantum well layer 110 is formed on the lower light confinement layer 108. The upper light confinement layer 112 is formed on the multiquantum well layer 110. The active layer 106 and the transparent core 168 are formed on the lower cladding layer 104, and are formed of a group III-V compound semiconductor. The multiquantum well layer 110 has a multiquantum well structure. The active layer 106 and the multiquantum well layer 110 may be formed of AlGaInAs, for example. As another example, the active layer 106 and the multiquantum well layer 110 may be formed of GaInAsP.

The transparent core 168 of the transparent waveguide 164 is formed on the lower cladding layer 104, and is formed of a material with higher bandgap energy than the active layer 106 in the semiconductor laser 162. In other words, the transparent core 168 is formed of a group III-V compound semiconductor having bandgap energy greater than the energy of the light oscillated by the semiconductor laser 162. For one example, the bandgap wavelength of the active layer 106 of the semiconductor laser 162 may be 1310 nm or 1550 nm, and the bandgap wavelength of the transparent core 168 may be 1100 nm or less, or 1300 nm or less. The difference between the bandgap wavelength of the active layer 106 and the bandgap wavelength of the transparent core 168 is preferably no less than 100 nm, more preferably no less than 200 nm. As a result, the transparent core 168 is transparent relative to the laser light emitted by the semiconductor laser 162.

The following describes why it is preferable for the difference between the bandgap wavelength of the active layer 106 and the bandgap wavelength of the transparent core 168 to be no less than 100 nm. Usually, the active layer 106 operates at a temperature greater than or equal to room temperature. When operating at a temperature greater than or equal to room temperature, the thermal energy of the carrier injected into the active layer 106 is approximately 26 meV or more. Here, the thermal energy of the carrier injected into the active layer 106 is known to follow a Maxwell-Boltzmann distribution, and therefore there is fluctuation that is approximately equal to the thermal energy of the carrier, i.e. fluctuation of approximately 26 meV. Therefore, in order to enable the electrons that fluctuate to the high-energy side from the center of the carrier thermal energy distribution to also pass through the transparent core 168, the difference between the bandgap wavelength of the transparent core and the bandgap wavelength of the active layer 106 is increased by 26 meV beyond the center, e.g. 26 meV, of the carrier thermal energy distribution.

Since 1 meV corresponds to approximately 1.3 nm, if the bandgap wavelength difference is 100 nm or more, this is sufficiently larger than 2×26 meV, which corresponds to approximately 64 nm. Furthermore, concerning the thermal energy of the carriers injected into the active layer 106, when the center of the distribution is approximately 26 meV, the existence probability of a carrier having thermal energy of approximately 2×26 meV decreases to approximately $e^{-2}$. Therefore, almost no light with a bandgap wavelength 100 nm less than that of the active layer 106 is emitted from the active layer 106. In addition, even if light with this wavelength were emitted from the active layer 106, there would only be a very small amount of the light, and therefore the transparent core 168 is transparent with respect to the light emitted from the active layer 106.

The semiconductor laser 162 and the transparent waveguide 164 may share portions of the same layer. For example, the active layer 106 of the semiconductor laser 162 and the transparent core 168 of the transparent waveguide 164 may be formed at the same time using shared configurational elements. However, in the optical integrated device 100, the active layer 106 and the transparent core 168 have different element composition ratios. For example, the transparent core 168 is formed of a group III-V compound semiconductor that is thinner and has a lower In composition ratio than the active layer 106. When a group III-V compound semiconductor has a lower In composition ratio, the bandgap energy will be greater. Accordingly, the bandgap energy of the transparent core 168 is higher than the bandgap energy of the active layer 106. Furthermore, the In composition ratio of the transparent core 168 gradually decreases in a direction from the interface between the semiconductor laser 162 and the transparent waveguide 164 toward the interface between the optical waveguide 166 and the transparent waveguide 164. The change of the composition ratio in the transparent core 168 may be continuous. Furthermore, the In composition ratio of the transparent core 168 is the same as the In composition ratio of the active layer 106 at the interface between the semiconductor laser 162 and the transparent waveguide 164.

The active layer 106 and the transparent core 168 may both be formed of AlGaInAs, for example. The In composition ratio of the transparent core 168 is less than that of the active layer 106.

The thickness of the transparent core 168 at the connection interface between the optical waveguide 166 and the transparent waveguide 164 is less than the thickness of the transparent core 168 at the interface between the configurational portions of the transparent waveguide 164 and the configurational portions of the semiconductor laser 162. At this time, the thickness of the multiquantum well layer 110 of the transparent core 168 includes a portion that is less than the thickness of the multiquantum well layer 110 of the active layer 106, and therefore there is a portion at which the bandgap energy of the transparent core 168 is greater than the bandgap energy of the active layer 106. Furthermore, with the conditions described above, at least the bandgap energy of the transparent core 168 at the connection interface between the optical waveguide 166 and the transparent waveguide 164 is greater than the bandgap energy of the transparent core 168 at the interface between the configurational portions of the transparent waveguide 164 and the configurational portions of the semiconductor laser 162.

Furthermore, the thickness of the transparent core 168 may decrease in a direction from the interface between the semiconductor laser 162 and the transparent waveguide 164 toward the interface between the optical waveguide 166 and the transparent waveguide 164. The thickness change of the transparent core 168 may be continuous.

The upper cladding layer 114 of the semiconductor laser 162 and the transparent waveguide 164 is formed on the active layer 106 and the transparent core 168. The upper cladding layer 114 is formed of a group III-V compound semiconductor with a lower refractive index than the active layer 106 and the transparent core 168. For example, the upper cladding layer 114 may be formed of p-InP.

The upper cladding layer 114 may be formed continuously from the semiconductor laser 162 to the transparent waveguide 164. The thickness of the upper cladding layer 114 of the transparent waveguide 164 at the connection interface between the optical waveguide 166 and the transparent waveguide 164 is less than the thickness of the upper cladding layer 114 of the semiconductor laser 162 at the interface between the configurational portions of the transparent waveguide 164 and the configurational components of the semiconductor laser 162.

The upper cladding layer 114 has a uniform thickness and composition at the semiconductor laser 162, but in the transparent waveguide 164, the thickness gradually decreases in a direction from the interface between the semiconductor laser 162 and the transparent waveguide 164 toward the interface between the optical waveguide 166 and the transparent waveguide 164. The decrease in thickness may be continuous.

In the semiconductor laser 162 and the transparent waveguide 164, the p-InP layer 115 on the upper cladding layer 114 is formed of p-InP. In the semiconductor laser 162, the contact layer 116 is formed on the p-InP layer 115. The contact layer 116 is formed of a group III-V compound semiconductor. For example, the contact layer 116 may be formed of p-InGaAs or p-InGaGaP. The p-side electrode 118 is formed on the contact layer 116.

In the optical waveguide 166, the core layer 120 is formed of a group III-V compound semiconductor on the lower cladding layer 104. The core layer 120 is formed of a material that is transparent with respect to the laser light oscillated by the semiconductor laser 162, and serves as an optical path in the optical waveguide 166. The thickness of the core layer 120 may be the same as the thickness of the transparent core 168 at the optical waveguide 166 end thereof In the optical waveguide 166, the upper cladding layer 122 is formed on the core layer 120. The upper cladding layer 122 is formed of a material with a lower refractive index than the core layer 120. The upper cladding layer 122 may be formed of non-doped InP, for example. The upper cladding layer 122 may be formed of the same material as the upper cladding layer 114. The thickness of the upper cladding layer 122 may be the same as the thickness of the upper cladding layer 114 at the optical waveguide 166 end thereof. The core layer 120 and the upper cladding layer 122 may be formed by regrowth.

In the optical waveguide 166, the p-InP layer 115 is formed on the upper cladding layer 122, and is formed of p-InP. In the optical waveguide 166, the protective film 124 is formed on the p-InP layer 115. The upper cladding layer 122 has a top surface that is parallel to the substrate 102, and therefore the p-InP layer 115 and the protective film 124 are formed parallel to the substrate 102 in the optical waveguide 166. Furthermore, in the transparent waveguide 164, the protective film 124 is formed on the p-InP layer 115. The top surface of the upper cladding layer 114 is inclined, with a higher portion at the interface between the configurational portions of the semiconductor laser 162 and the configurational portions of the transparent waveguide 164 and a lower portion at the connection interface between the optical waveguide 166 and the transparent waveguide 164. Therefore, in the transparent waveguide 164, the p-InP layer 115 and the protective film 124 are formed at an incline to be higher on the semiconductor laser 162 side and lower on the optical waveguide 166 side. The protective film 124 may be formed of SiN or $SiO_2$, for example.

In the semiconductor laser 162, the transparent waveguide 164, and the optical waveguide 166, the n-side electrode 130 is formed on the back surface of the substrate 102. The contact layer 116 and the p-side electrode 118 are formed above the active layer 106. Accordingly, in the semiconductor laser 162, current is injected into the active layer 106 from the n-side electrode 130 and the p-side electrode 118, and is laser-oscillated by the active layer 106. In other words, the p-side electrode 118 formed above the active layer 106 is an electrode for operating an optically active element. On the other hand, since the contact layer 116 and the p-side electrode 118 are not formed above the transparent core 168, the carriers injected into the transparent core 168 are fewer in number than the carriers injected into the active layer 106. Since the p-side electrode 118 is not formed above the core layer 120, the optical waveguide 166 is a passive waveguide, and is not an optically active element.

The laser light emitted from the semiconductor laser 162 is guided to the transparent core 168 from the active layer 106. The bandgap energy of the transparent core 168 is greater than the bandgap energy of the active layer 106. Accordingly, with respect to the laser light oscillated by the active layer 106, the transmission factor of the transparent core 168 is higher than that of the active layer 106, and therefore the absorption loss of the transparent core 168 is lower.

The current injected from the p-side electrode 118 flows into the n-side electrode 130 from the contact layer 116 while expanding. The current also expands to the transparent waveguide 164 at the transparent waveguide 164 end of the contact layer 116. In the optical integrated device 100, the transparent waveguide 164 is formed between the semiconductor laser 162 and the optical waveguide 166. Therefore, the expanding current can be decreased at the regrowth interface between the transparent core 168 and the core layer 120. Accordingly, degradation of the regrowth interface caused by current flowing through the regrowth interface between the transparent core 168 and the core layer 120 can be decreased. In other words, the transparent waveguide 164 can prevent the degradation of the regrowth interface between the transparent core 168 and the core layer 120, and therefore high reliability can be achieved for the optical integrated device 100. Furthermore, the transparent waveguide 164 causes the regrowth interface between the transparent core 168 and the core layer 120 to be distanced from the semiconductor laser 162. As a result, the alignment tolerance during formation of the contact layer 116 and the p-side electrode 118 of the semiconductor laser 162 is improved, thereby improving the yield of the manufacturing process and characteristics of the optical integrated device 100.

The length of the transparent waveguide 164 is preferably greater than or equal to the total of the thickness of the active layer 106, the thickness of the upper cladding layer 114, and the thickness of the p-InP layer 115, for example. In other words, the length of the transparent waveguide 164 is preferably greater than or equal to the total thickness from the bottommost surface of the lower light confinement layer 108 to the bottommost surface of the contact layer 116 on the upper cladding layer 114. The reason for this is as follows. The current injected from the p-side electrode 118 flows from the contact layer 116 to the active layer 106 of the semiconductor laser 162 and the transparent core 168 of the transparent waveguide 164. Here, by setting the length of the transparent waveguide 164 to be greater than or equal to the total thickness described above, the resistance from the contact layer 116 to the transparent core 168 becomes greater than the resistance from the contact layer 116 to the active layer 106. Accordingly, it is difficult for the current injected from the contact layer 116 to expand to the regrowth interface between the transparent core 168 and the core layer 120 or to reach this regrowth interface. As a result, the current flowing through the regrowth interface between the transparent core 168 and the core layer 120 can be decreased, and therefore the degradation of the regrowth interface can be significantly reduced.

When the bandgap wavelength of the active layer 106 is 1310 nm, the thickness of the active layer 106 is generally approximately 120 nm, the thickness of the upper cladding layer 114 is approximately 0.5 µm, and the thickness of the p-InP layer 115 is approximately 2 µm, resulting in a total thickness of 2.62 µm for these layers. At this time, if the length of the transparent waveguide 164 is greater than 3 nm, the current flowing through the regrowth interface between the transparent core 168 and the core layer 120 can be decreased. However, when considering the error tolerance during manufacturing, the length of the transparent waveguide 164 is preferably set in a range from approximately 10 µm to 30 µm. As a result, the current expanding at the interface between the transparent core 168 and the core layer 120 can be decreased. The length of the transparent waveguide 164 refers to the distance of the transparent waveguide 164 in a direction parallel to the direction of the optical path for the laser light oscillated by the active layer 106.

The material used for the multiquantum well layer 110 may be AlGaInAs. The region of the multiquantum well layer 110 contacting the regrowth interface is oxidized during the process for forming the mesa structure described further below. The Al atoms in the AlGaInAs are easily oxidized, and therefore using AlGaInAs as the material for the multiquantum well layer 110 results in the region contacting the regrowth interface of the multiquantum well layer 110 having worse crystallinity than in a case where a material that does not include Al, such as GaInAsP, is used. In a case where AlGaInAs is used for the multiquantum well layer 110, when forming the mesa structure using a butt-joint technique, the AlGaInAs of the multiquantum well layer 110 is exposed to the atmosphere. Specifically, the AlGaInAs surface of the multiquantum well layer 110 exposed to the atmosphere is oxidized. After this, crystal defects and migration, for example, may occur at the regrowth interface between the multiquantum well layer 110 and the core layer 120 formed using the regrowth technique. Specifically, objects of non-radiative recombination are formed at the regrowth interface, and migration occurs and propagates when the carriers reach the regrowth interface due to conduction, resulting in degradation of the semiconductor laser 162. On the other hand, in the present embodiment, the current (carriers) dispersed toward the regrowth interface is reduced, and the transparent core 168 is formed of a material that is transparent with respect to the laser light emitted by the active layer 106. Therefore, the transparent core 168 does not absorb the laser light and carriers are not generated. Accordingly, when AlGaInAs is used in the multiquantum well layer 110, a significantly stronger effect is realized compared to using GaInAsP in the multiquantum well layer 110.

Figure 3:
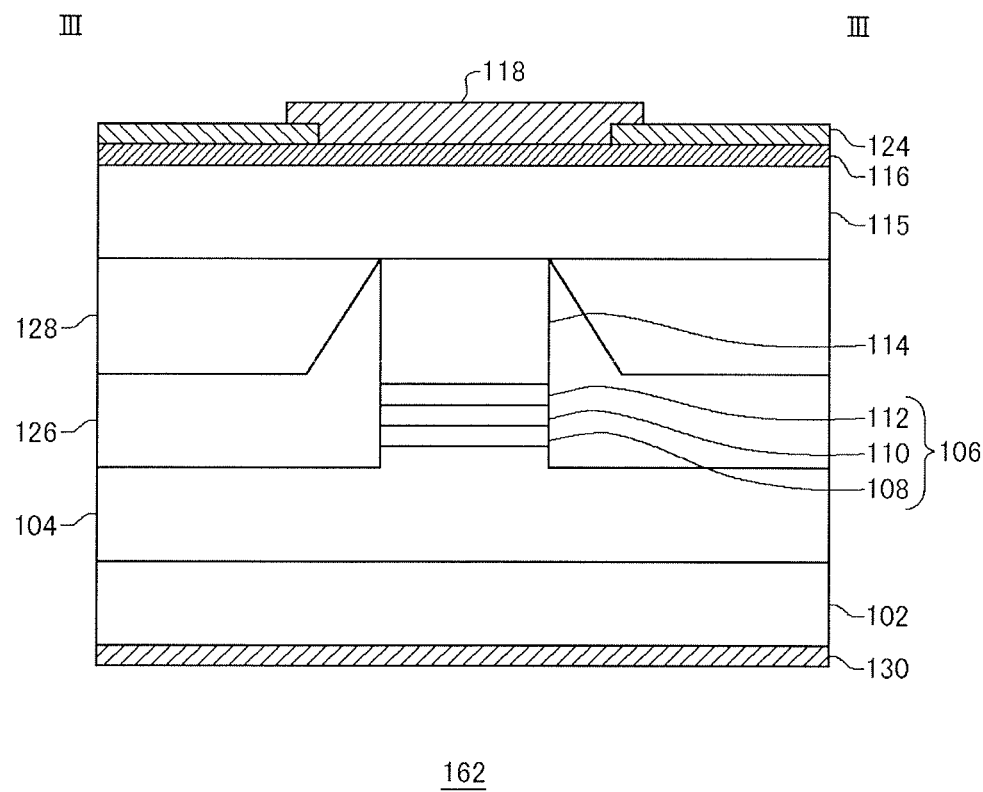
FIG. 3 is a schematic cross-sectional view of the semiconductor laser of the optical integrated device according to the first embodiment.

FIG. 3 is a schematic cross-sectional view of the semiconductor laser 162 of the optical integrated device 100 according to the first embodiment, over the line of FIG. 1. In the III-III cross section, the semiconductor laser 162 includes the substrate 102, the lower cladding layer 104, the active layer 106, the upper cladding layer 114, the p-InP layer 115, the contact layer 116, the p-side electrode 118, the n-side electrode 130, the embedded layer 126, the current stopping layer 128, and the protective film 124.

In the semiconductor laser 162 shown in the cross section, a portion of the lower cladding layer 104, the active layer 106, and the upper cladding layer 114 have a mesa structure, and are embedded in the embedded layer 126 and the current stopping layer 128. Specifically, regions of the active layer 106 and the upper cladding layer 114 that are not under the p-side electrode 118 are removed in the semiconductor laser 162. Furthermore, in the region where the active layer 106 and the upper cladding layer 114 are removed, a portion of the lower cladding layer 104 is removed in the thickness direction, such that the lower cladding layer 104 in this region is thinner than in other regions.

In the region where a portion of the lower cladding layer 104, the active layer 106, and the upper cladding layer 114 are removed, the embedded layer 126 is formed on the lower cladding layer 104. The embedded layer 126 is formed to cover the side surfaces of the lower cladding layer 104, the active layer 106, and the upper cladding layer 114. In other words, in the region where the embedded layer 126 contacts the active layer 106 and the upper cladding layer 114, the thickness of the embedded layer 126 is equal to the total of the thickness of the active layer 106, the thickness of the upper cladding layer 114, and the thickness removed from the lower cladding layer 104. In regions other than the region where the embedded layer 126 contacts the active layer 106 and the upper cladding layer 114, the thickness of the embedded layer 126 is less than the total of the thickness of the active layer 106, the thickness of the upper cladding layer 114, and the thickness removed from the lower cladding layer 104. Accordingly, the top surface of the embedded layer 126 has an inclined surface near the regions where the embedded layer 126 contacts the active layer 106 and the upper cladding layer 114. The current stopping layer 128 is formed on the embedded layer 126, and the top surface of the current stopping layer 128 is within the same flat plane as the top surface of the upper cladding layer 114.

The embedded layer 126 may be formed of p-InP, for example. The current stopping layer 128 may be formed of n-InP, for example. In the semiconductor laser 162, the p-InP layer 115 is formed on the upper cladding layer 114 and the current stopping layer 128. The contact layer 116 is formed on the p-InP layer 115. The protective film 124 is formed on the contact layer 116, in the regions above the embedded layer 126 and the current stopping layer 128.

The p-side electrode 118 is formed on the contact layer 116, in the region where the protective film 124 is not formed. In other words, the p-side electrode 118 is formed above the region where the active layer 106 and the upper cladding layer 114 are formed. The p-side electrode 118 may be formed on a part of the ends of the protective film 124 in a manner to extend beyond the region where the protective film 124 is not formed. The p-side electrode 118 may be wider than the active layer 106 and the upper cladding layer 114. Here, "width" refers to the length in a direction perpendicular to the thickness of the active layer 106 in the cross-sectional view of FIG. 3. With the embedded configuration, current is injected efficiently from the p-side electrode 118 and the n-side electrode 130 to the active layer 106.

Figure 4:
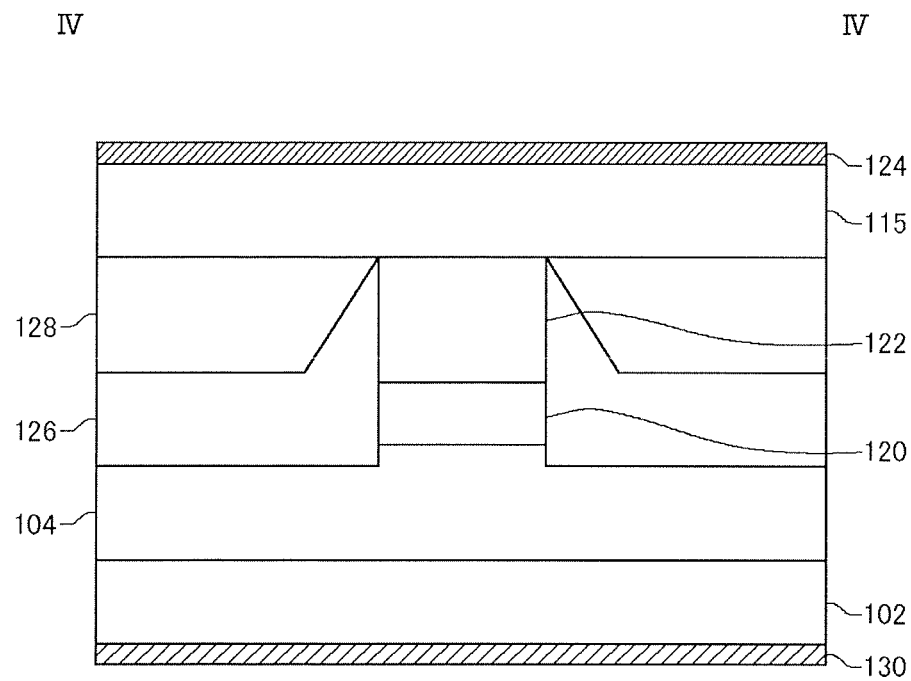
FIG. 4 is a schematic cross-sectional view of the optical waveguide of the optical integrated device according to the first embodiment.

FIG. 4 is a schematic cross-sectional view of the optical waveguide 166 of the optical integrated device 100 according to the first embodiment, over the line FV-IV of FIG. 1. In the IV-IV cross section, the optical waveguide 166 includes the substrate 102, the lower cladding layer 104, the core layer 120, the upper cladding layer 122, the p-InP layer 115, the n-side electrode 130, the embedded layer 126, the current stopping layer 128, and the protective film 124.

In the optical waveguide 166, a portion of the lower cladding layer 104, the core layer 120, and the upper cladding layer 122 have a mesa structure, and are embedded in the embedded layer 126 and the current stopping layer 128. In other words, the core layer 120 and the upper cladding layer 122 are removed from regions other than the region serving as the optical path in the central portion of the cross section shown in FIG. 4. Furthermore, a portion of the lower cladding layer 104 is removed in the thickness direction in the region where the core layer 120 and the upper cladding layer 122 are removed, such that the thickness of the lower cladding layer 104 in this region is less than in other regions.

In the region where a portion of the lower cladding layer 104, the core layer 120, and the upper cladding layer 122 are removed, the embedded layer 126 is formed on the lower cladding layer 104. The embedded layer 126 is formed to cover the side surfaces of the lower cladding layer 104, the core layer 120, and the upper cladding layer 122. In other words, in the region where the embedded layer 126 contacts the core layer 120 and the upper cladding layer 122, the thickness of the embedded layer 126 is equal to the total of the thickness of the core layer 120, the thickness of the upper cladding layer 122, and the thickness removed from the lower cladding layer 104. In regions other than the region where the embedded layer 126 contacts the core layer 120 and the upper cladding layer 122, the thickness of the embedded layer 126 is less than the total of the thickness of the core layer 120, the thickness of the upper cladding layer 122, and the thickness removed from the lower cladding layer 104. Accordingly, the top surface of the embedded layer 126 has inclined surface near the regions where the embedded layer 126 contacts the core layer 120 and the upper cladding layer 122. The current stopping layer 128 is formed on the embedded layer 126, and the top surface of the current stopping layer 128 is within the same flat plane as the top surface of the upper cladding layer 122. In the optical waveguide 166, the p-InP layer 115 is formed on the upper cladding layer 122 and on the current stopping layer 128. The protective film 124 is formed on the p-InP layer 115.

Figure 5:
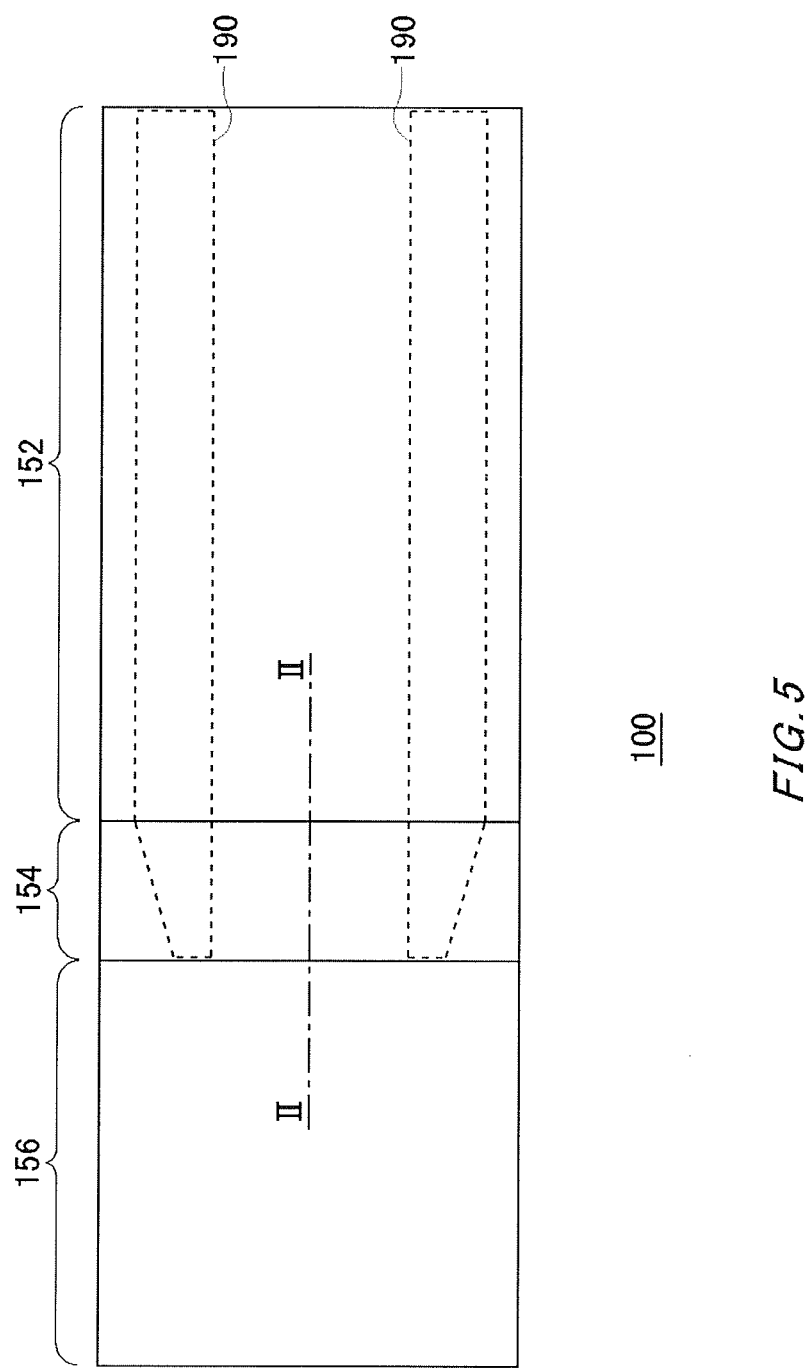
FIG. 5 is a planar view of a manufacturing process of the optical integrated device according to the first embodiment.

FIG. 5 is a planar view of a manufacturing process for selectively growing the optical integrated device 100 according to the first embodiment. A selective growth mask 190 is formed on the lower cladding layer 104, in the regions indicated by the dashed lines in the semiconductor laser region 152 and the transparent region 154. The selective growth mask 190 is not formed in the optical waveguide region 156.

Figure 6:
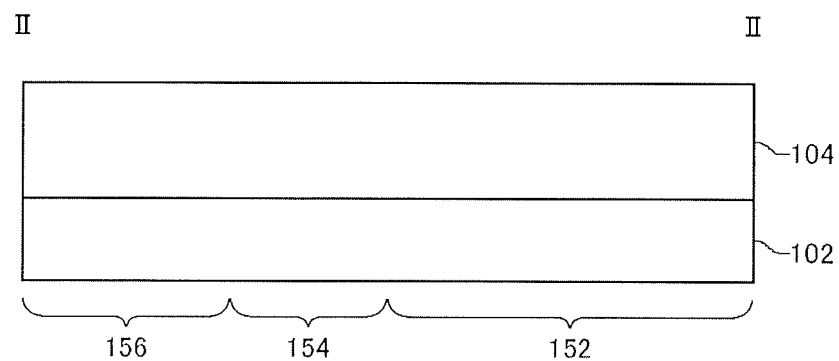
FIG. 6 is a cross-sectional view of a state in which the lower cladding layer is formed on the substrate, in the manufacturing process of the optical integrated device according to the first embodiment.

FIG. 6 is a schematic cross-sectional view over the line II-II of FIG. 5. In the manufacturing process for selectively growing the optical integrated device 100 according to the first embodiment, first, the lower cladding layer 104 is formed on the substrate 102. The lower cladding layer 104 formed at this time may be that of a bottom portion. For example, the bottom portion of the lower cladding layer 104 may be formed of n-InP on an n-InP substrate using MOCVD. The substrate 102 includes the semiconductor laser region 152 where the semiconductor laser 162 is to be formed, the transparent region 154 where the transparent waveguide 164 is to be formed, and the optical waveguide region 156 where the optical waveguide 166 is to be formed.

Figure 7:
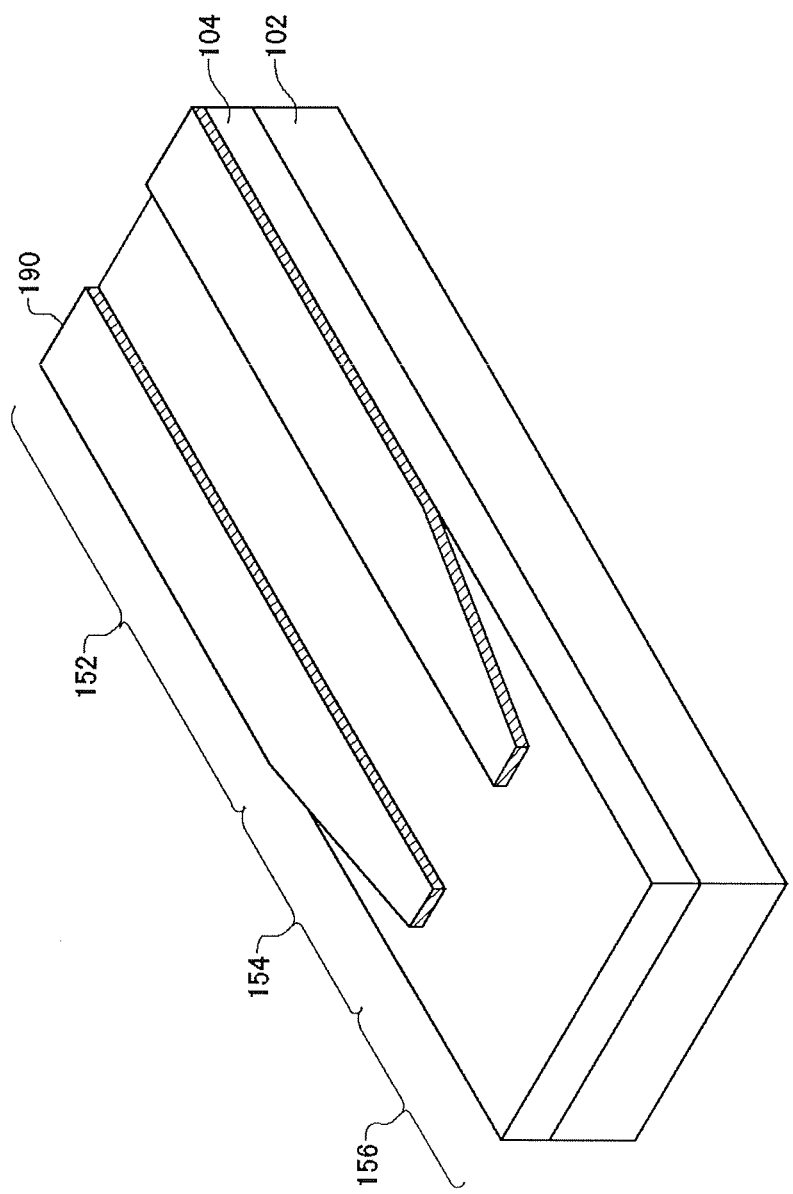
FIG. 7 is a schematic perspective view of a state in which the selective growth mask has been formed, in the manufacturing process of the optical integrated device according to the first embodiment.

FIG. 7 is a schematic perspective view of a state in which the selective growth mask 190 has been formed, in the manufacturing process for selectively growing the optical integrated device 100 according to the first embodiment. The selective growth mask 190 is formed on the lower cladding layer 104. In the semiconductor laser region 152 and the transparent region 154, the mask 190 is formed in the regions where the active layer 106, the upper cladding layer 114, and the core layer 120 are not formed. The width of the mask 190 in the transparent region 154 is less than the width of the mask 190 in the semiconductor laser region 152. The "width" of the mask 190 refers to the size of the mask 190 in a direction that is parallel to the top surface of the lower cladding layer 104 and perpendicular to the optical path direction in the waveguide formed on the lower cladding layer 104. The mask 190 may be formed of $SiO_2$, for example.

When selectively growing a group III-V compound semiconductor, it is easier for the group III element to migrate than it is for the group V element, due to the mask 190, and the group III element is therefore more likely to be taken into the group III-V compound semiconductor film being formed. In particular, In migrates more easily than other elements. Therefore, when the group III-V compound semiconductor film is formed on the semiconductor laser region 152, this film has a higher In composition ratio than the group III-V compound semiconductor film formed on the transparent region 154.

In the transparent region 154, the width of the mask 190 may become continuously smaller in a direction from the interface between the semiconductor laser region 152 and the transparent region 154 toward the interface between the transparent region 154 and the optical waveguide region 156. At the interface between the transparent region 154 and the optical waveguide region 156, the mask 190 has a prescribed width, and the mask 190 in the transparent region 154 may have a trapezoidal surface when seen from above. It should be noted that, at the interface between the transparent region 154 and the optical waveguide region 156, the mask 190 does not have any width, and may form a triangle in the transparent region 154 as seen from above.

If the lower cladding layer 104 formed on the substrate 102 prior to the mask 190 being formed was a bottom portion, the remaining portion of the lower cladding layer 104 is now formed. Next, the lower light confinement layer 108, the multiquantum well layer 110, the upper light confinement layer 112, and the upper cladding layer 114 are selectively grown.

Figure 8:
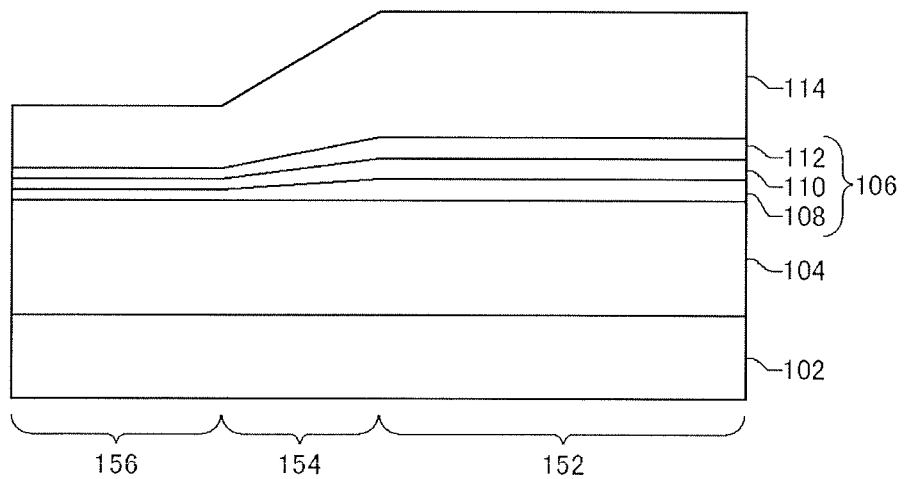
FIG. 8 is a schematic cross-sectional view of a state in which up to the upper cladding layer has been selectively grown, in the manufacturing process of the optical integrated device according to the first embodiment.

FIG. 8 is a schematic cross-sectional view of a state in which up to the upper cladding layer 114 has been selectively grown, in the manufacturing process of the optical integrated device 100 according to the first embodiment. FIG. 8 is a cross section corresponding to the schematic cross section over II-II of FIG. 5. The semiconductor laser region 152 and the transparent region 154 may include portions shared with each other. For example, when forming the first waveguide, the lower light confinement layer 108, the multiquantum well layer 110, the upper light confinement layer 112, and the upper cladding layer 114 may be formed continuously of the same elements in the semiconductor laser region 152, the transparent region 154, and the optical waveguide region 156. Furthermore, at least one layer among the lower light confinement layer 108, the multiquantum well layer 110, the upper light confinement layer 112, and the upper cladding layer 114 may be shared, and may be formed at the same time in the semiconductor laser region 152 and the transparent region 154. The lower light confinement layer 108, the multiquantum well layer 110, the upper light confinement layer 112, and the upper cladding layer 114 have a constant thickness in the semiconductor laser region 152 and the waveguide region 156, and a thickness that decreases continuously in the transparent region 154 in a direction from the interface with the semiconductor laser region 152 toward the interface with the optical waveguide region 156.

The lower light confinement layer 108, the multiquantum well layer 110, the upper light confinement layer 112, and the upper cladding layer 114 have constant composition ratios in the semiconductor laser region 152 and the optical waveguide region 156, but in the transparent region 154, the composition ratio of the group III element decreases continuously in a direction from the interface with the semiconductor laser region 152 toward the interface with the optical waveguide region 156. In particular, the In composition ratio in the lower light confinement layer 108, the multiquantum well layer 110, the upper light confinement layer 112, and the upper cladding layer 114 decreases continuously in the transparent region 154, in a direction from the interface with the semiconductor laser region 152 toward the interface with the optical waveguide region 156. Namely, in the state shown in FIG. 6, the composition ratio of the group III element of the lower light confinement layer 108, the multiquantum well layer 110, the upper light confinement layer 112, and the upper cladding layer 114 in the transparent region 154 is the same as the group III element composition ratio in the semiconductor laser region 152 at the interface between the transparent region 154 and the semiconductor laser region 152, and is the same as the group III element composition ratio in the optical waveguide region 156 at the interface between the transparent region 154 and the optical waveguide region 156.

Figure 9:
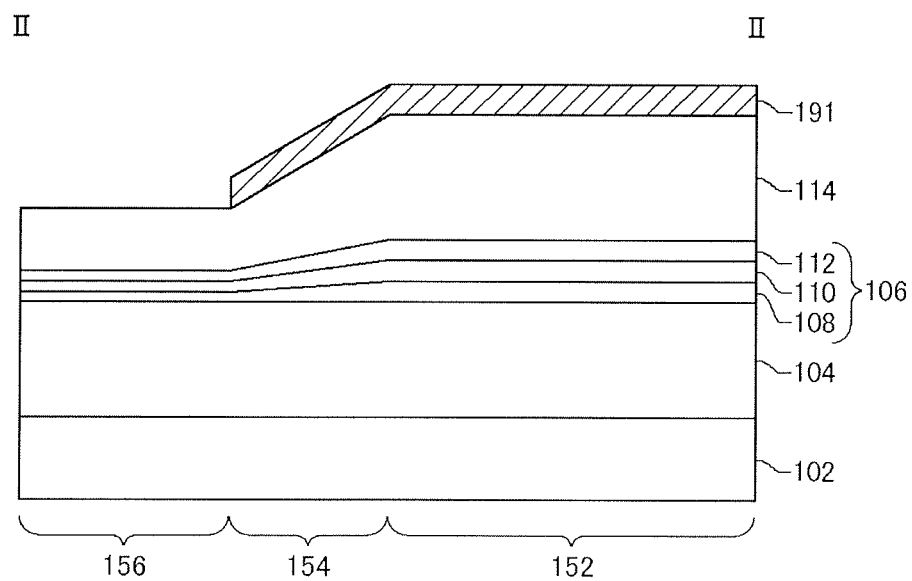
FIG. 9 is a schematic cross-sectional view of a state in which the mask has been formed, in the manufacturing process of the optical integrated device according to the first embodiment.

FIG. 9 is a schematic cross-sectional view of a state in which the mask 190 has been removed and the mask 191 has been formed in the transparent region 154 and the semiconductor laser region 152, in the manufacturing process for selectively growing the optical integrated device 100 according to the first embodiment. FIG. 9 shows a cross section corresponding to the schematic cross section over II-II of FIG. 5.

Figure 10:
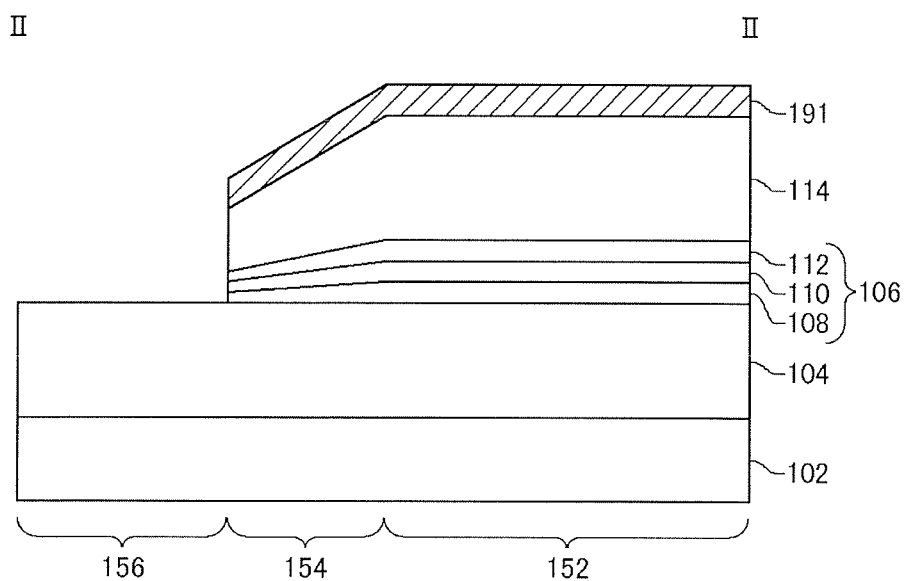
FIG. 10 is a schematic cross-sectional view of a state in which etching has been performed, in the manufacturing process of the optical integrated device according to the first embodiment.

FIG. 10 is a schematic cross-sectional view of a state in which layers above the lower cladding layer 104 in the optical waveguide region 156 have been etched, from the state shown in FIG. 9. This etching may be dry etching. The lower light confinement layer 108, the multiquantum well layer 110, the upper light confinement layer 112, and the upper cladding layer 114 in the optical waveguide region 156 are removed by etching.

Figure 11:
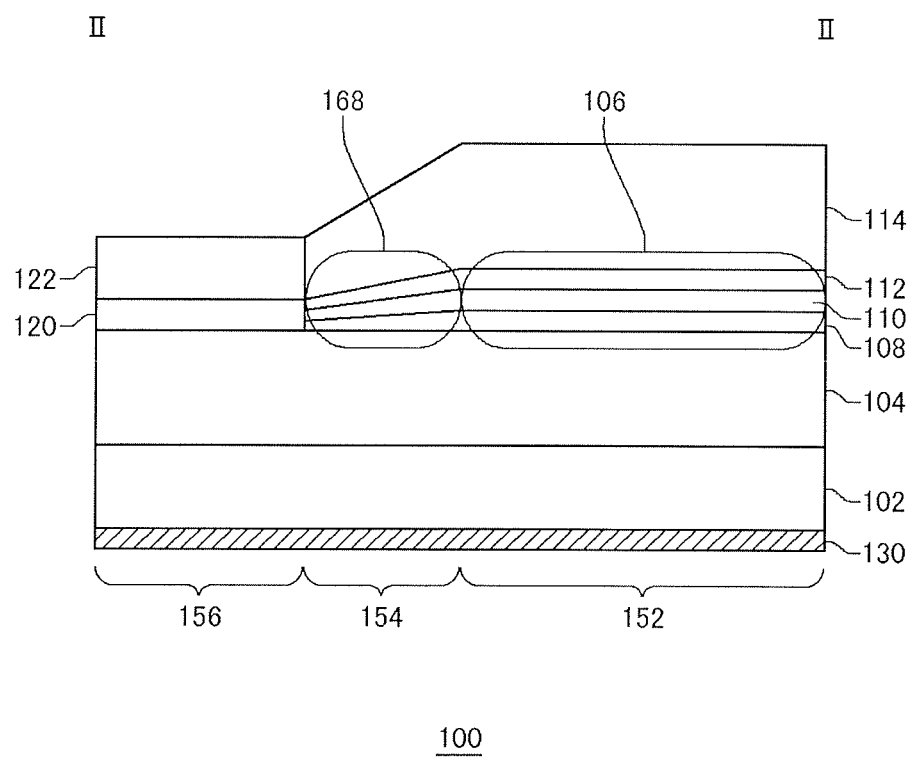
FIG. 11 is a schematic cross-sectional view of a state in which the core layer and the upper cladding layer are formed in the optical waveguide region, in the manufacturing process of the optical integrated device according to the first embodiment.

FIG. 11 is a schematic cross-sectional view of a state in which the core layer 120 and the upper cladding layer 122 are formed in the optical waveguide region 156 from which the lower light confinement layer 108, the multiquantum well layer 110, the upper light confinement layer 112, and the upper cladding layer 114 have been removed. The core layer 120 and the upper cladding layer 122 are formed to cover the end surfaces of the lower light confinement layer 108, the multiquantum well layer 110, the upper light confinement layer 112, and the upper cladding layer 114, which are exposed at the interface between the transparent region 154 and the optical waveguide region 156 (formation step of the second waveguide). The multiquantum well layer 110 and the core layer 120 may be formed of AlGaInAs, or of a material that does not include Al, such as GaInAsP. If the multiquantum well layer 110 and the core layer 120 are formed using GaInAsP, the number of objects of non-radiative recombination at the regrowth interface are significantly decreased, compared to a case in which AlGaInAs is used.

The mask is formed of SiN in a striped shape on the upper cladding layer 114 and the upper cladding layer 122. By etching while using a stripe-shaped mask, the mesa structure of the semiconductor laser 162, the transparent waveguide 164, and the optical waveguide 166 is formed. Next, the embedded layer 126 and the current stopping layer 128 are grown in an embedded manner. In this way, the embedded structure of the semiconductor laser 162, the transparent waveguide 164, and the optical waveguide 166 is formed. The process for forming this embedded structure is the same as the usual method for forming an embedded structure. The p-InP layer 115 is formed on the upper cladding layer 114, the upper cladding layer 122, and the current stopping layer 128. The contact layer 116 is formed on the p-InP layer 115, in the semiconductor laser region 152.

In the semiconductor laser 162, the transparent waveguide 164, and the optical waveguide 166, the protective film 124 is formed on the p-InP layer 115 and the contact layer 116. In the semiconductor laser region 152, a portion of the protective film 124 on the contact layer 116 is removed, and the p-side electrode 118 is formed in the region from which the protective film 124 was removed. The n-side electrode 130 is formed on the back surface of the substrate 102, thereby realizing the optical integrated device 100.

The above describes the optical integrated device 100 according to the first embodiment, but the changes in thickness and composition ratio of the transparent core 168 in the transparent waveguide 164 are not limited to continuous changes. For example, the thickness and the In composition ratio of the transparent core 168 may decrease in stages in a direction from the interface between the semiconductor laser 162 and the transparent waveguide 164 toward the interface between the optical waveguide 166 and the transparent waveguide 164. Furthermore, the changes of the thickness and composition ratio of the upper cladding layer 114 in the transparent waveguide 164 are not limited to continuous changes. For example, the thickness and the In composition ratio of the upper cladding layer 114 may decrease in stages in a direction from the interface between the semiconductor laser 162 and the transparent waveguide 164 toward the interface between the optical waveguide 166 and the transparent waveguide 164.

Instead of the mask 190 shown in FIG. 5, a mask 190 may be used having a width that decreases in stages in the transparent region 154, in a direction from the interface between the semiconductor laser region 152 and the transparent region 154 toward the interface between the transparent region 154 and the optical waveguide region 156. In this way, in the transparent region 154, the changes in thickness and composition ratio of the transparent core 168 and the upper cladding layer 114 can be set in stages.

Figure 12:
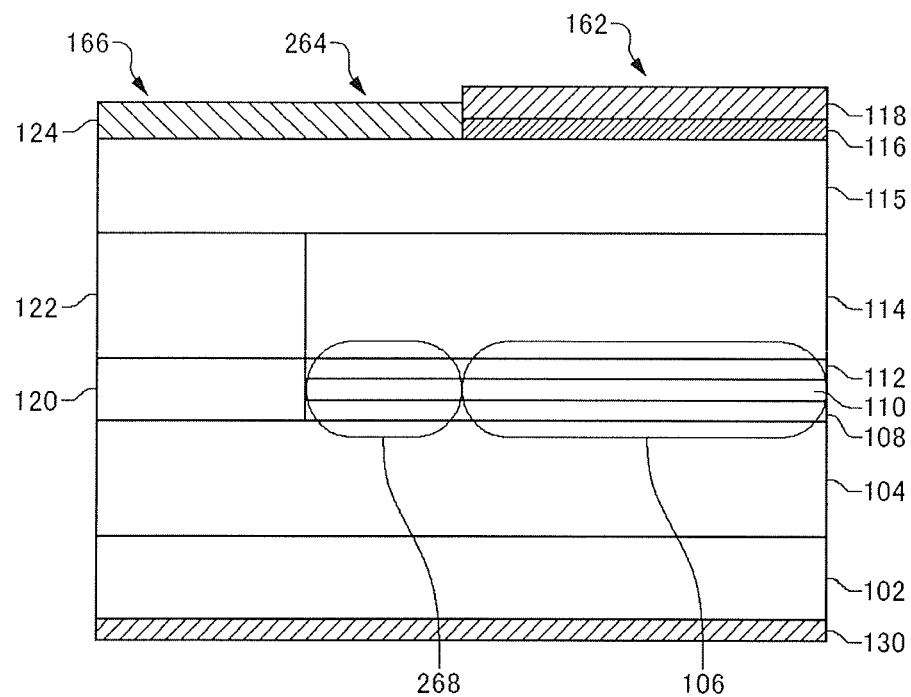
FIG. 12 is a schematic cross-sectional view of the semiconductor laser, a transparent waveguide, and the optical waveguide of an optical integrated device according to a second embodiment of the present invention.

FIG. 12 is a schematic cross-sectional view of the semiconductor laser 162, a transparent waveguide 264, and the optical waveguide 166 of an optical integrated device 200 according to a second embodiment of the present invention. In FIG. 12, components that have the same function and configuration as components in FIG. 2 may be given the same reference numerals. The optical integrated device 200 has the same overhead view as the optical integrated device 100 shown in FIG. 1, and FIG. 7 is a schematic cross-sectional view of the optical integrated device 200 over the II-II of FIG. 1. The semiconductor laser 162 and the optical waveguide 166 of the optical integrated device 200 may each have the cross sections shown in FIGS. 3 and 4, in the same manner as in the optical integrated device 100.

The semiconductor laser 162 includes the substrate 102, the lower cladding layer 104, the active layer 106, the upper cladding layer 114, the p-InP layer 115, the contact layer 116, the p-side electrode 118, and the n-side electrode 130. The active layer 106 includes the lower light confinement layer 108, the multiquantum well layer 110, and the upper light confinement layer 112, and serves as an optical path in the semiconductor laser 162. In the cross section over II-II, the optical waveguide 166 includes the substrate 102, the lower cladding layer 104, the core layer 120, the upper cladding layer 122, the p-InP layer 115, the protective film 124, and the n-side electrode 130.

In the cross section over II-II, the transparent waveguide 264 includes the substrate 102, the lower cladding layer 104, a transparent core 268, the upper cladding layer 114, the p-InP layer 115, the protective film 124, and the n-side electrode 130. The transparent core 268 includes the lower light confinement layer 108, the multiquantum well layer 110, and the upper light confinement layer 112 extending from the active layer 106 of the semiconductor laser 162, and serves as an optical path in the transparent waveguide 264. The lower light confinement layer 108, the multiquantum well layer 110, and the upper light confinement layer 112 of the transparent core 268 have thicknesses respectively the same as the thicknesses of the lower light confinement layer 108, the multiquantum well layer 110, and the upper light confinement layer 112 of the active layer 106, and have constant thicknesses in the transparent waveguide 264. Accordingly, in the transparent waveguide 264, the top surfaces of the lower light confinement layer 108 the multiquantum well layer 110, and the upper light confinement layer 112 are parallel to the front surface of the substrate 102.

The transparent waveguide 264 is provided between the semiconductor laser 162 and the optical waveguide 166. The transparent core 268 of the transparent waveguide 264 is formed on the lower cladding layer 104, and is formed of a material having higher bandgap energy than the active layer 106 of the semiconductor laser 162. In other words, the transparent core 268 is formed of a group III-V compound semiconductor having bandgap energy that is greater than the energy of the light oscillated by the semiconductor laser 162. For example, the bandgap wavelength of the active layer 106 of the semiconductor laser 162 may be 1310 nm or 1550 nm, and the bandgap wavelength of the transparent core 268 may be from 1100 nm to 1300 nm. The difference between the bandgap wavelength of the active layer 106 and the bandgap wavelength of the transparent core 268 is preferably no less than 100 nm, more preferably no less than 200 nm. As a result, the transparent core 268 is transparent with respect to the laser light emitted by the semiconductor laser 162.

The active layer 106 of the semiconductor laser 162 and the transparent core 268 of the transparent waveguide 264 are formed continuously and of the same elements. However, while the transparent core 268 is disordered to form a compound semiconductor that has high bandgap energy, the active layer 106 differs on the point that it is formed of a compound semiconductor that is not disordered.

In the transparent waveguide 264, the upper cladding layer 114 is formed on the transparent core 268. The thickness of the upper cladding layer 114 of the transparent waveguide 264 is the same as the thickness of the upper cladding layer 114 of the semiconductor laser 162. Accordingly, the front surface of the upper cladding layer 114 of the transparent waveguide 264 is parallel to the substrate 102. The p-InP layer 115 is formed on the upper cladding layer 114. The protective film 124 is formed on the p-InP layer 115 of the transparent waveguide 264.

The contact layer 116 and the p-side electrode 118 are not formed above the transparent core 268. Accordingly, the carriers injected into the transparent core 268 are fewer in number than the carriers injected into the active layer 106.

The laser light oscillated by the semiconductor laser 162 is guided to the transparent core 268 from the active layer 106.

The bandgap energy of the disordered transparent core 268 is greater than the bandgap energy of the active layer 106, and therefore the transmission factor of the transparent core 268 with respect to the laser light oscillated and emitted by the active layer 106 is higher than the transmission factor of the active layer 106, and the absorption loss is lower.

The current injected from the p-side electrode 118 flows from the contact layer 116 to the n-side electrode 130 while expanding. At the transparent waveguide 264 end of the contact layer 116, the current expands to the transparent waveguide 264. In the optical integrated device 200, the transparent waveguide 264 is provided between the semiconductor laser 162 and the optical waveguide 166. Therefore, the expanding current can be decreased at the regrowth interface between the transparent core 268 and the core layer 120. Accordingly, degradation of the regrowth interface between the transparent core 268 and the core layer 120 can be decreased and degradation of the regrowth interface between the transparent core 268 and the core layer 120 can be prevented, thereby achieving high reliability for the optical integrated device 200.

The length of the transparent waveguide 264 is preferably greater than or equal to the total of the thickness of the active layer 106, the thickness of the upper cladding layer 114, and the thickness of the p-InP layer 115, for example, and is more preferably from 10 μm to 30 μm. As a result, the current flowing through the interface between the transparent core 268 and the core layer 120 can be decreased. The "length" of the transparent waveguide 264 refers to the distance of the transparent waveguide 264 in a direction parallel to the direction of the optical path of the laser light modulated by the active layer 106.

The optical integrated device 200 may be formed in the same manner as the optical integrated device 100, except for the method used to form the transparent waveguide 264. The method for forming the transparent waveguide 264 is described below.

Figure 13:
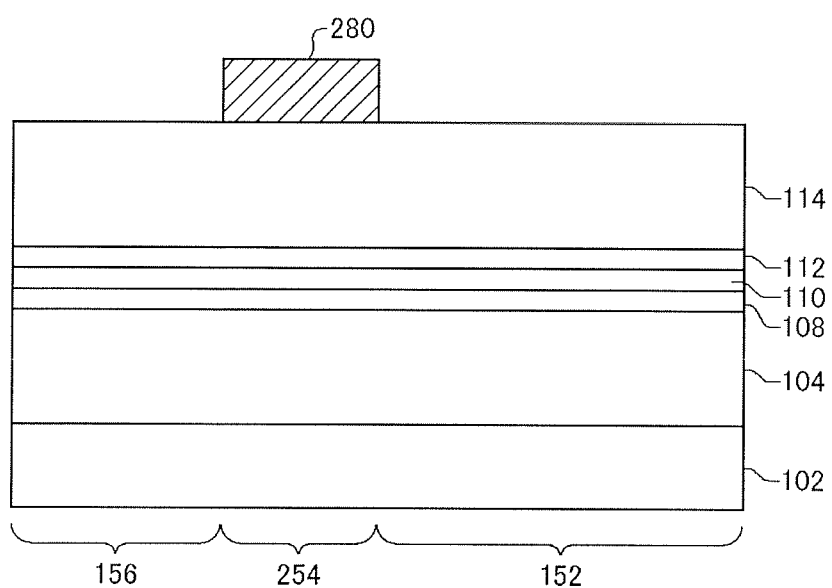
FIG. 13 is a schematic cross-sectional view of a state in which an activating layer has been formed on the upper cladding layer, in the manufacturing process of the optical integrated device according to the second embodiment.

FIG. 13 is a schematic cross-sectional view of a state in which an activating layer 280 has been formed on the upper cladding layer 114, in the manufacturing process of the optical integrated device 200 according to the second embodiment. The substrate 102 includes the semiconductor laser region 152 where the semiconductor laser 162 is to be formed, a transparent region 254 where the transparent waveguide 264 is to be formed, and the optical waveguide region 156 where the optical waveguide 166 is to be formed. In the semiconductor laser region 152, the transparent region 254, and the optical waveguide region 156, the lower cladding layer 104, the lower light confinement layer 108, the multiquantum well layer 110, the upper light confinement layer 112, and the upper cladding layer 114 are formed on the substrate 102. The lower light confinement layer 108, the multiquantum well layer 110, the upper light confinement layer 112, and the upper cladding layer 114 may be epitaxially grown over the entire surface of the lower cladding layer 104, or may be selectively grown. In the semiconductor laser region 152, the transparent region 254, and the optical waveguide region 156, the lower light confinement layer 108, the multiquantum well layer 110, the upper light confinement layer 112, and the upper cladding layer 114 have the same thickness.

In the transparent region 254, the activating layer 280 is formed on the upper cladding layer 114. The activating layer 280 promotes disordering the lower light confinement layer 108, the multiquantum well layer 110, and the upper light confinement layer 112. The activating layer 280 may be formed of $SiO_2$, for example. Next, the entire substrate on which the activating layer 280 is formed is thermally processed. As a result of this thermal processing, in the transparent region 254, the group III element disperses from the lower light confinement layer 108, the multiquantum well layer 110, and the upper light confinement layer 112 into the activating layer 280. Therefore, in the transparent region 254, the lower light confinement layer 108, the multiquantum well layer 110, and the upper light confinement layer 112 are disordered and the bandgap energy increases. The thermal processing may be rapid thermal annealing (RTA) at 915° C. for 30 seconds. The transparent core 268 is formed by the disordered lower light confinement layer 108, multiquantum well layer 110, and upper light confinement layer 112. As another example, the activating layer 280 may be formed by SiN deposited in nitrogen-rich conditions. After this, the activating layer 280 is removed.

Figure 14:
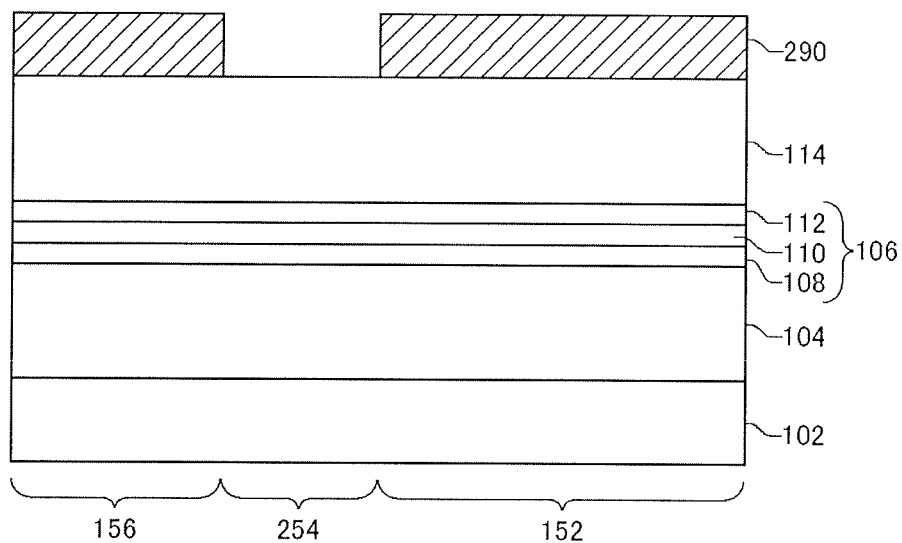
FIG. 14 is a schematic cross-sectional view of a state in which a mask is formed on the upper cladding layer, in the manufacturing process of the optical integrated device according to the second embodiment.

FIG. 14 is a schematic cross-sectional view of a state in which a mask 290 is formed on the upper cladding layer 114, as another method for achieving the disordering. In the same manner as shown in FIG. 8, the lower cladding layer 104, the lower light confinement layer 108, the multiquantum well layer 110, the upper light confinement layer 112, and the upper cladding layer 114 are formed on the substrate 102 in the semiconductor laser region 152, the transparent region 254, and the optical waveguide region 156. The mask 290 is formed on the upper cladding layer 114 in the semiconductor laser region 152 and the optical waveguide region 156. The mask 290 may be formed of a-Si, for example. The mask 290 may be formed of a photoresist. Ions are injected from above the mask 290. The mask 290 includes an opening in the transparent region 254, and the ions are injected through the transparent region 254 to cause disordering in the lower light confinement layer 108, the multiquantum well layer 110, the upper light confinement layer 112, and the upper cladding layer 114. The injected ions may be protons (H+), for example. The transparent core 268 is formed by the disordered lower light confinement layer 108, multiquantum well layer 110, and upper light confinement layer 112. After this, the mask 290 is removed.

Figure 15:
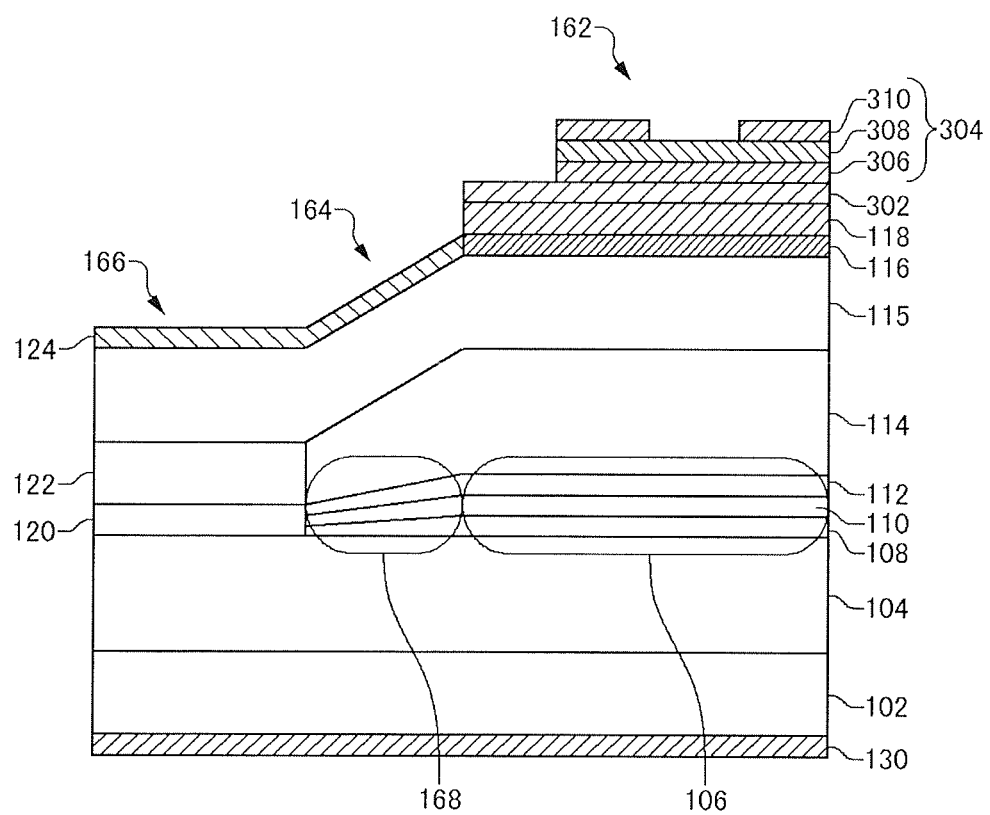
FIG. 15 is a schematic cross-sectional view of the semiconductor laser, the transparent waveguide, and the optical waveguide of an optical integrated device according to a third embodiment of the present invention.

FIG. 15 is a schematic cross-sectional view of the semiconductor laser 162, the transparent waveguide 164, and the optical waveguide 166 of an optical integrated device 300 according to a third embodiment of the present invention. In FIG. 15, components having the same function and configuration as components shown in FIG. 2 are given the same reference numerals. Further, the optical integrated device 300 has the same overhead view as the optical integrated device 100 shown in FIG. 1, and FIG. 15 is a schematic cross-sectional view of the optical integrated device 300 over the II-II of FIG. 1. The semiconductor laser 162 and the optical waveguide 166 of the optical integrated device 300 may each have the cross sections shown in FIGS. 3 and 4, in the same manner as in the optical integrated device 100.

The semiconductor laser 162 includes the substrate 102, the lower cladding layer 104, the active layer 106, the upper cladding layer 114, the p-InP layer 115, the contact layer 116, the p-side electrode 118, the n-side electrode 130, an insulating layer 302, and a micro heater 304. The active layer 106 includes the lower light confinement layer 108, the multiquantum well layer 110, and the upper light confinement layer 112. The micro heater 304 includes a Ti layer 306, a Pt layer 308, and an Au layer 310.

The insulating layer 302 is formed on the p-side electrode 118. The insulating layer 302 may be formed of SiN, for example. The micro heater 304 is formed on the insulating layer 302, in all of or a portion of the semiconductor laser 162. The micro heater 304 is formed by layering the Ti layer 306, the Pt layer 308, and the Au layer 310. A portion of the Au layer 310 formed on the Pt layer 308 is removed to form at least two regions that are not connected to each other. There is a large electrical resistance between these separated regions of the Au layer 310. Accordingly, as a result of current flowing between the separated portions of the Au layer 310, a portion or all of the semiconductor laser 162 can be heated.

The transparent waveguide 164 includes the substrate 102, the lower cladding layer 104, the transparent core 168, the upper cladding layer 114, the p-InP layer 115, the protective film 124, and the n-side electrode 130. The transparent core 168 includes the lower light confinement layer 108, the multiquantum well layer 110, and the upper light confinement layer 112 extending from the active layer 106 of the semiconductor laser 162. The optical waveguide 166 includes the substrate 102, the lower cladding layer 104, the core layer 120, the upper cladding layer 122, the p-InP layer 115, the protective film 124, and the n-side electrode 130.

When the semiconductor laser 162 is heated by the micro heater 304, the bandgap energy of the active layer 106 decreases. As a result, the difference in bandgap energy between the transparent core 168 and the active layer 106 increases. Accordingly, due to the heating, the transmittance factor of the transparent core 168 with respect to the laser light oscillated by the active layer 106 becomes higher than the transmission factor when heating is not performed. In other words, a large decrease is seen in the absorption loss in the transparent core 168. Since the current expanding in the interface between the transparent core 168 and the core layer 120 is decreased by the transparent core 168, degradation of the interface between the transparent core 168 and the core layer 120 can be prevented.

The above describes embodiments of the present invention, but the scope of the present invention is not limited by the above embodiments. For example, the transparent core 168 of the optical integrated device 100 or the optical integrated device 300 may be disordered. The semiconductor laser 162 may be a DFB laser including diffraction grating. Instead of the semiconductor laser 162, another optically active element can be used. Specifically, the transparent waveguide 164 or the transparent waveguide 264 may be formed between the optical waveguide 166 and an SOA (optical amplifier) or an EA modulator. The laser, SOA, and EA modulator may each be integrated monolithically.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "in advance," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An optical integrated device comprising:
    a first waveguide that is formed on a substrate and includes a first optical path;
    an electrode formed on the first waveguide;
    a second waveguide that is formed on the substrate and includes a second optical path; and
    a transparent waveguide that is formed on the substrate between the first waveguide and the second waveguide, and includes a transparent core that serves as an optical path and is formed of a material having higher bandgap energy than the first optical path, wherein
    the transparent waveguide is a passive waveguide with which an electrode for operation is not provided throughout its length,
    the transparent core has greater thickness at an interface with the first waveguide than at an interface with the second waveguide,
    the electrode is formed above the first waveguide and is not formed above the transparent waveguide,
    elements including the first waveguide are each optically active elements that operate according to current injected thereto, wherein the optically active elements include an active layer,
    the active layer and the transparent core respectively include a quantum well layer, and
    a difference between a bandgap wavelength of the active layer and a bandgap wavelength of the transparent core is equal to or greater than 100 nm.

2. The optical integrated device according to claim 1, wherein
    the transparent core is formed of the same elements as the first optical path, and has a different elemental composition ratio than the first optical path.

3. The optical integrated device according to claim 2, wherein
    the transparent core is formed of a group III-V compound semiconductor, and has bandgap energy that increases in a direction from an interface with the first waveguide toward an interface with the second waveguide.

4. The optical integrated device according to claim 1, wherein
    the transparent core is formed of a disordered compound semiconductor.

5. The optical integrated device according to claim 1, further comprising a heating section that heats the first waveguide.

6. The optical integrated device according to claim 1, wherein
    the first waveguide is formed of AlGaInAs or GaInAsP.

7. The optical integrated device according to claim 1, wherein
    the first waveguide includes a lower light confinement layer, a multiquantum well layer formed on the lower light confinement layer, an upper light confinement layer formed on the multiquantum well layer, and an upper cladding layer formed on the upper light confinement layer, and
    length of the transparent waveguide is greater than or equal to total length from a bottommost surface of the lower light confinement layer to a bottommost surface of a contact layer formed on the upper cladding layer.

8. The optical integrated device according to claim 1, wherein
    the first waveguide is a semiconductor laser element, an optical amplifier, or an EA modulator, and
    the second waveguide is an optical waveguide that does not include an electrode.

9. The optical integrated device of claim 1, wherein a thickness of the quantum well layer included in the transparent core of the transparent waveguide becomes thinner in a direction from the first waveguide toward the second waveguide.

\* \* \* \* \*